US011181789B2

(12) United States Patent
Lee et al.

(10) Patent No.: US 11,181,789 B2
(45) Date of Patent: Nov. 23, 2021

(54) LIQUID CRYSTAL DISPLAY DEVICE

(71) Applicant: SAMSUNG DISPLAY CO., LTD., Yongin-si (KR)

(72) Inventors: Luly Lee, Yongin-si (KR); Jaesang Lee, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 56 days.

(21) Appl. No.: 15/902,283

(22) Filed: Feb. 22, 2018

(65) Prior Publication Data

US 2018/0246353 A1    Aug. 30, 2018

(30) Foreign Application Priority Data

Feb. 27, 2017    (KR) .................. 10-2017-0025224

(51) Int. Cl.
| | |
|---|---|
| *G02F 1/136* | (2006.01) |
| *F21V 8/00* | (2006.01) |
| *H05K 1/11* | (2006.01) |
| *G02F 1/1343* | (2006.01) |
| *G02F 1/1333* | (2006.01) |
| *G02F 1/13357* | (2006.01) |

(52) U.S. Cl.
CPC ........... *G02F 1/136* (2013.01); *G02B 6/0036* (2013.01); *G02B 6/0066* (2013.01); *G02F 1/133308* (2013.01); *G02F 1/134336* (2013.01); *H05K 1/118* (2013.01); *G02B 6/0038* (2013.01); *G02B 6/0053* (2013.01); *G02B 6/0088* (2013.01); *G02F 1/133317* (2021.01); *G02F 1/133615* (2013.01); *G02F 2201/121* (2013.01); *G02F 2201/123* (2013.01)

(58) Field of Classification Search
None
See application file for complete search history.

(56) References Cited

U.S. PATENT DOCUMENTS

| | | | |
|---|---|---|---|
| 6,147,725 A | * | 11/2000 | Yuuki ................. G02B 6/0036 349/61 |
| 8,134,658 B2 | | 3/2012 | Shiraishi |
| 8,456,593 B2 | | 6/2013 | Park et al. |
| | | | (Continued) |

FOREIGN PATENT DOCUMENTS

| | | |
|---|---|---|
| CN | 101226304 A | 7/2008 |
| CN | 102434820 A | 5/2012 |
| | (Continued) | |

OTHER PUBLICATIONS

Chinese Office Action for Application No. 201810161318.6 dated Sep. 24, 2021, citing the above reference(s).

*Primary Examiner* — Edward J Glick
*Assistant Examiner* — David Y Chung
(74) *Attorney, Agent, or Firm* — Cantor Colburn LLP

(57) ABSTRACT

A liquid crystal display device includes: a display panel; a light source which provides a light to the display panel; a light guide plate which receives the light from the light source on a surface thereof and guides the light to another surface thereof; a polarization member on a surface of the display panel facing the light guide plate; and a frame chassis comprising a fastening portion inserted in a space between the display panel and the light guide plate. The fastening portion has a thickness substantially equal to a thickness of the polarization member.

23 Claims, 9 Drawing Sheets

(56) References Cited

U.S. PATENT DOCUMENTS

| | | | |
|---|---|---|---|
| 8,508,685 B2 | 8/2013 | Lee et al. | |
| 8,605,233 B2 | 12/2013 | Lee et al. | |
| 9,182,535 B2 | 11/2015 | Lee et al. | |
| 9,429,698 B2 | 8/2016 | Lee et al. | |
| 9,551,893 B2 | 1/2017 | An et al. | |
| 2010/0165254 A1* | 7/2010 | Lee | G02B 6/0036 |
| | | | 349/65 |
| 2012/0075552 A1* | 3/2012 | Lee | G02B 6/0091 |
| | | | 349/62 |
| 2012/0262647 A1* | 10/2012 | Hu | G02B 6/0091 |
| | | | 349/65 |
| 2012/0281151 A1* | 11/2012 | Abe | G02B 6/0091 |
| | | | 348/739 |
| 2012/0287355 A1* | 11/2012 | Oya | G02B 6/0031 |
| | | | 348/790 |
| 2013/0141651 A1* | 6/2013 | Kuromizu | G02B 6/0088 |
| | | | 348/739 |
| 2015/0092385 A1* | 4/2015 | Baek | G02B 6/0053 |
| | | | 362/19 |
| 2016/0147005 A1* | 5/2016 | Sasaki | G02B 6/0031 |
| | | | 349/65 |

FOREIGN PATENT DOCUMENTS

| | | |
|---|---|---|
| CN | 103969868 A | 8/2014 |
| CN | 105339727 A | 2/2016 |
| KR | 1020110118388 A | 10/2011 |
| KR | 101319543 B1 | 10/2013 |
| KR | 1020150067836 A | 6/2015 |
| KR | 1020150117751 A | 10/2015 |
| KR | 101651888 | 8/2016 |

\* cited by examiner

LIQUID CRYSTAL DISPLAY DEVICE

This application claims priority to Korean Patent Application No. 10-2017-0025224, filed on Feb. 27, 2017, and all the benefits accruing therefrom under 35 U.S.C. § 119, the content of which in its entirety is herein incorporated by reference.

BACKGROUND

1. Field

Embodiments of the invention relate to a liquid crystal display ("LCD") device, and more particularly, to an LCD device having a light weight, thinness, and high luminance.

2. Discussion of Related Art

An LCD device, which is one of the most widely used types of flat panel display ("FPD") device, typically includes two substrates, on which electrodes are provided, and a liquid crystal layer interposed between the two substrates. The LCD device may adjust an amount of transmitted light by applying voltage to the electrodes to rearrange liquid crystal molecules of the liquid crystal layer.

An LCD device, which is a passive light emitting device, typically includes a display substrate for displaying an image and a backlight unit for providing light to the display substrate. The backlight unit is classified into a direct type backlight unit, an edge type backlight unit and a corner type backlight unit according to the location of a light source.

The edge type backlight unit is widely used because the edge type backlight unit is easier to manufacture, light in weight, and has low power consumption than the direct type backlight unit. The edge type backlight unit may include a plurality of optical sheets between a light guide plate and an LCD panel. The plurality of optical sheets may diffuse or collimate the light provided from the light source.

SUMMARY

Recently, in a liquid crystal display ("LCD") device, optical sheets between a light guide plate and a liquid crystal display ("LCD") panel may be omitted, and a light guide plate and a LCD panel may be closely arranged to reduce a thickness thereof. In such an LCD device, a new frame structure for accommodating and fastening the light source, the light guide plate or the like is desired.

Embodiments of the invention are directed to a LCD device having a new frame structure for accommodating and fastening a light source and a light guide plate, in which an optical sheet is omitted.

According to an exemplary embodiment, a LCD device includes: a display panel; a light source which provides a light to the display panel; a light guide plate which receives the light from the light source on a surface thereof and guides the light to another surface thereof; a polarization member on a surface of the display panel facing the light guide plate; and a frame chassis including a fastening portion inserted in a space between the display panel and the light guide plate. In such an embodiment, the fastening portion has a thickness substantially equal to a thickness of the polarization member.

In an exemplary embodiment, the LCD device may further include a lower frame which accommodates the light source and the light guide plate.

In an exemplary embodiment, the LCD device may further include an extrusion bar between the light source and the lower frame.

In an exemplary embodiment, the light guide plate may include: a light incidence surface facing the light source; a light opposing surface opposing the light incidence surface; an upper surface facing the display panel; and a lower surface opposing the upper surface.

In an exemplary embodiment, the fastening portion may fasten a portion of the upper surface adjacent to the light incidence surface.

In an exemplary embodiment, the frame chassis may include a coupling portion extending from the fastening portion and coupled to at least one of the extrusion bar and the lower frame.

In an exemplary embodiment, the frame chassis may be coupled to at least one of the extrusion bar and the lower frame in a screw coupling manner.

In an exemplary embodiment, the fastening portion may have a thickness in a range from about 0.3 millimeter (mm) to about 1.0 mm.

In an exemplary embodiment, the frame chassis may include at least one of stainless steel, aluminum, an aluminum alloy, magnesium, a magnesium alloy, copper, a copper alloy, and an electrogalvanized steel sheet.

In an exemplary embodiment, the frame chassis may further include a reflection member disposed on a surface of the frame chassis facing the light source.

In an exemplary embodiment, the lower frame may include: a back surface portion; a side surface portion bent and extending from the back surface portion; and a bent portion bent and extending from the side surface portion.

In an exemplary embodiment, the bent portion may have a thickness substantially equal to a thickness of the polarization member.

In an exemplary embodiment, the LCD device may further include a reflection sheet between the light guide plate and the lower frame.

According to an exemplary embodiment, an LCD device includes: a display panel; a light source which provides a light to the display panel; a light guide plate which receives the light from the light source on a surface thereof and guides the light to another surface thereof; a polarization member on a surface of the display panel facing the light guide plate; a lower frame which accommodates the light source and the light guide plate; and a light guide plate holder at an edge portion of the lower frame.

In an exemplary embodiment, the light guide plate holder may include a support portion, a side wall portion and a light guide plate seating portion, which collectively fasten an upper surface, a light incidence surface and a lower surface of the light guide plate.

In an exemplary embodiment, the side wall portion may have a thickness substantially equal to a distance between the light source and the light guide plate.

In an exemplary embodiment, the light guide plate holder may further include a reflection sheet seating portion extending from the light guide plate seating portion with a height less than a height of the light guide plate seating portion.

In an exemplary embodiment, the light guide plate holder may further include a light guide plate holder fastening portion extending from the reflection sheet seating portion with a height less than a height of the reflection sheet seating portion.

In an exemplary embodiment, the light guide plate holder may further include a protrusion portion protruding from the light guide plate holder fastening portion.

In an exemplary embodiment, the light guide plate may further include at least one of polymethylmethacrylate ("PMMA"), an acrylic resin, polycarbonate, and a tempered glass.

According to an exemplary embodiment, an LCD device includes: a display panel; a light source which provides a light to the display panel; a light guide plate which receives the light from the light source on a surface thereof and guides the light to another surface thereof; a polarization member on a surface of the display panel facing the light guide plate; a lower frame which accommodates the light source and the light guide plate; and a fastening portion inserted in a space between the display panel and the light guide plate. In such an embodiment, the light guide plate includes: a light incidence surface facing the light source; a light opposing surface opposing the light incidence surface; an upper surface facing the display panel; and a lower surface opposing the upper surface. In such an embodiment, the light guide plate further includes a lens pattern defined on the upper surface.

In an exemplary embodiment, the lens pattern may include a plurality of lenses which extend in a first direction and arranged along a second direction which crosses the first direction.

In an exemplary embodiment, the lens may have a semicircular or semi-elliptical cross-section.

In an exemplary embodiment, the light guide plate may include a prism pattern defined on the lower surface.

In an exemplary embodiment, the prism pattern may include a plurality of prisms arranged along a direction perpendicular to the light incidence surface.

In an exemplary embodiment, the prisms may have a length extending in a direction parallel to the light incidence surface, and the length of the prisms gradually may increase from the light incidence surface toward the light opposing surface.

In an exemplary embodiment, the prisms may have at least one of a recessed shape or a protruded shape.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
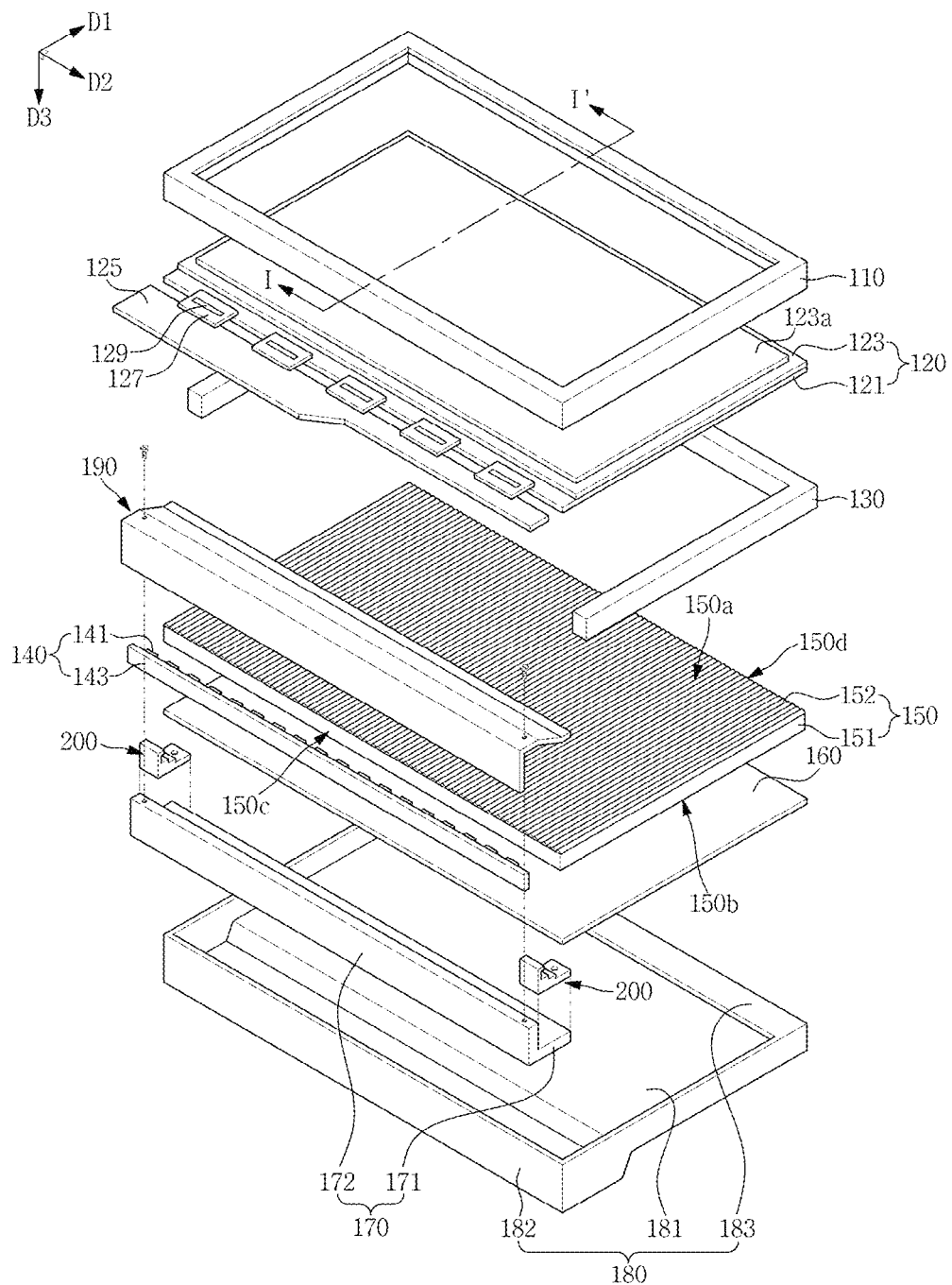
FIG. 1 is an exploded perspective view illustrating a display device according to an exemplary embodiment.

Exemplary embodiments will now be described more fully hereinafter with reference to the accompanying drawings. Although the invention may be modified in various manners and have several exemplary embodiments, exemplary embodiments are illustrated in the accompanying drawings and will be mainly described in the specification. However, the scope of the invention is not limited to the exemplary embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," or the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Herein, detailed descriptions of some of conventional parts may be omitted or simplified to specifically describe embodiments of the invention, and like reference numerals refer to like elements throughout the specification.

Hereinafter, for convenience of description, exemplary embodiments where the display device is a liquid crystal display ("LCD") device, will be described in detail, but exemplary embodiments are not limited thereto. Any display device that receives a light from a backlight unit to display images may be included in the scope of the invention.

Figure 2:
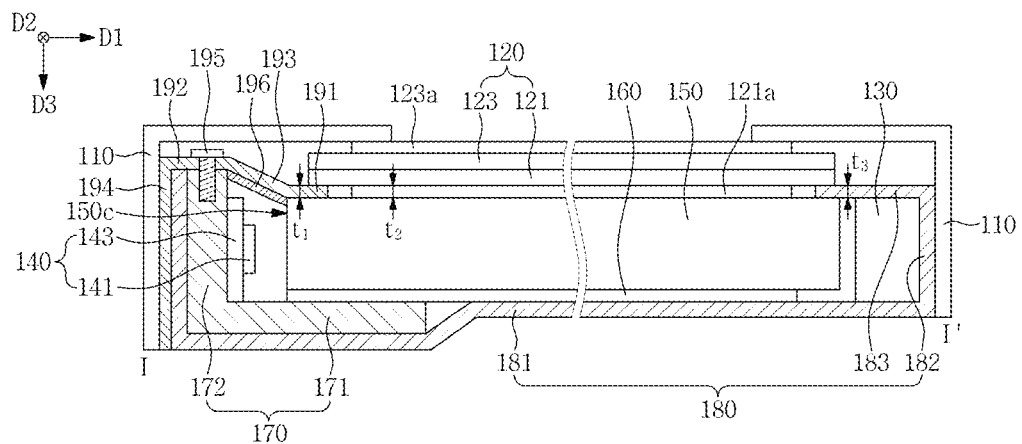
FIG. 2 is a cross-sectional view taken along line I-I' of FIG. 1.

FIG. 1 is an exploded perspective view illustrating a display device according to an exemplary embodiment, and FIG. 2 is a cross-sectional view taken along line I-I' of FIG. 1.

Referring to FIGS. 1 and 2, an exemplary embodiment of a display device includes an upper frame 110, a display panel 120, an intermediate frame 130, a light source portion 140, a light guide plate 150, a reflection sheet 160, an extrusion bar 170, a lower frame 180, a frame chassis 190, a light guide plate holder 200, or the like.

In such an embodiment, the intermediate frame 130, the light source portion 140, the light guide plate 150, the reflection sheet 160, the extrusion bar 170, the lower frame 180, the frame chassis 190, the light guide plate holder 200 or the like are collectively define or referred to as a backlight unit.

In such an embodiment, as shown in FIG. 1, an opening window for exposing an active area of the display panel 120 to an outside is defined in the upper frame 110, and the upper frame 110 is disposed to cover an edge of a front surface and a side surface of the display panel 120. The upper frame 110 may include a rigid metal material such as stainless steel or a material having high heat dissipation properties such as aluminum or an aluminum alloy.

The display panel 120 may be in a quadrangular plate shape to receive an electric signal from the outside and to display an image. The display panel 120 may include a first substrate 121, a second substrate 123 opposing the first substrate 121, a liquid crystal layer (not illustrated) between the first substrate 121 and the second substrate 123, or the like.

The first substrate 121 includes a plurality of pixel electrodes arranged in a matrix form, a thin film transistor for applying a driving voltage to each of the pixel electrodes and various signal lines for driving the pixel electrodes and the thin film transistor.

The second substrate 123 is disposed opposite to the first substrate 121, and includes a common electrode including a transparent conductive material, and a color filter. The color filter may include red, green and blue color filters.

The liquid crystal layer (not illustrated) is interposed between the first substrate 121 and the second substrate 123, and is rearranged by an electric field generated between the pixel electrode and the common electrode. As such, the rearranged liquid crystal layer adjusts a transmittance of a light emitted from the backlight unit and passed therethrough, and the adjusted light passes through the color filter to display an image to the outside.

In such an embodiment, a lower polarization plate 121a may be further disposed on an outer surface (e.g. a rear surface or a lower surface) of the first substrate 121, and an upper polarization plate 123a may be further disposed on an outer surface (e.g., a front surface or an upper surface) of the second substrate 123. The upper polarization plate 123a and the lower polarization plate 121a may have a planar area corresponding to a planar area of the display panel 120.

The upper polarization plate 123a may transmit only a specific polarized light among the light arriving from the outside, and absorb or block the remaining light. The lower polarization plate 121a may transmit only a specific polarized light among the light emitted from the backlight unit, and absorb or block the remaining light.

A driving circuit board 125 may be disposed on at least one side of the display panel 120. The driving circuit board 125 may apply various control signals and a power signal for driving the display panel 120.

The display panel 120 and the driving circuit board 125 may be electrically connected to each other by a flexible printed circuit board ("FPCB") 127. The FPCB 127 may be a chip-on-film ("COF") type or a tape-carrier-package ("TCP") type, and the number of the FPCBs 127 may be variously modified depending on a size and driving scheme of the display panel 120.

A driving chip 129 may be disposed or mounted on the FPCB 127. The driving chip 129 may generate various driving signals for driving the display panel 120. The driving chip 129 may include a driver integrated circuit ("IC") or a source IC in which a timing controller and a data driving circuit are integrated into a single chip.

The intermediate frame 130 may support an edge of a back surface of the display panel 120. In an exemplary embodiment, the intermediate frame 130 may support the edge of the back surface of the display panel 120 except for one side where the light source portion 140 is disposed.

The intermediate frame 130 may have a polygonal frame shape with an empty space defined therein.

The intermediate frame 130 may be integrally formed as a single unitary and indivisible unit, or may include a plurality of frames assembled together to define the intermediate frame 130. The intermediate frame 130 may include a flexible material such as plastic, or may be formed through an injection molding process or the like. In an alternative exemplary embodiment, the intermediate frame 130 may be omitted.

The light source portion 140 includes a light source 141 and a light source substrate 143 on which the light source 141 is disposed.

The light source 141 may be disposed at a corner portion or to face a side surface of the light guide plate 150. In such an embodiment, the light source 141 may emit a light toward the corner portion or the side surface of the light guide plate 150. The light source 141 may include a light emitting diode ("LED") chip (not illustrated) and a package (not illustrated) for accommodating the LED chip. In one exemplary embodiment, for example, the LED chip (not illustrated) may be a gallium nitride (GaN)-based LED chip which emits a blue light.

The number of the light sources 141 may be variously modified in consideration of the size, luminance uniformity, or the like of the display panel 120. The light source substrate 143 may be a printed circuit board ("PCB") or a metal PCB.

The light source portion 140 may be disposed on a side surface, opposing side surfaces, or all four side surfaces of the light guide plate 150 in consideration of the size, luminance uniformity, or the like of the display panel 120. In an exemplary embodiment, the light source portion 140 may be disposed to face at least one of corner portions of the light guide plate 150. Hereinafter, for convenience of description, exemplary embodiments where the light source portion 140 is disposed on one side surface of the light guide plate 150 will be described in detail.

The light source portion 140 may be disposed on the extrusion bar 170 to be described below.

Although not illustrated in FIGS. 1 and 2, a wavelength conversion portion (not illustrated) may be disposed between the light source portion 140 and the light guide plate 150. The wavelength conversion portion (not illustrated) may include a material that may convert a wavelength of a light. In one exemplary embodiment, for example, the wavelength conversion portion may convert a wavelength of a blue light emitted from a blue LED light source into a white light.

FIG. 1 shows an exemplary embodiment where the light guide plate 150 having a plate shape for convenience of illustration, the light guide plate 150 may be in the form of a sheet or a film to slim down the display device. In such an embodiment, the light guide plate 150 may be in the shape of a plate and a film for guiding light.

Hereinafter, for ease of description, one surface of the light guide plate 150 facing the display panel 120 will be referred to as an upper surface 150a, another surface of the light guide plate 150 opposing the upper surface 150a will be referred to as a lower surface 150b, one surface of the light guide plate 150 facing the light source portion 140 will be referred to as a light incidence surface 150c, and another surface of the light guide plate 150 opposing the light incidence surface 150c will be referred to as a light opposing surface 150d.

In addition, for ease of descriptions, a direction perpendicular to the light incidence surface 150c will be referred to as a first direction D1, a length direction in which the light incidence surface 150c extends will be referred to as a second direction D2, and a thickness direction of the light guide plate 150 will be referred to as a third direction D3.

In an exemplary embodiment, the light guide plate 150 may include a body portion 151 and a plurality of lens patterns 152 defined on the body portion 151.

The body portion 151 may include a material having light transmitting characteristics, such as an acrylic resin, e.g., polymethylmethacrylate ("PMMA"), polycarbonate, or a tempered glass, to efficiently guide the light.

The plurality of lens patterns 152 on the body portion 151 may include a hard coating exclusive resin, and the resin may be ultraviolet ("UV")-cured to have properties similar to those of polycarbonate. The resin may include an oligomer, a monomer, a photo-initiator or silicone, and may be classified into a soft resin and a hard resin depending on a content of the silicon and monomer.

The shape of the plurality of lens patterns 152 on the body portion 151 will be described in greater detail below.

In an exemplary embodiment, the reflection sheet 160 may include, e.g., polyethylene terephthalate ("PET"), and have reflecting properties, and one surface thereof may be coated with a diffusion layer including, for example, titanium dioxide. In such an embodiment, the reflection sheet 160 may include a material including a metal such as silver (Ag).

In an exemplary embodiment, as shown in FIG. 2, the extrusion bar 170 may be disposed between the light source portion 140 and the lower frame 180. In one exemplary embodiment, for example, the light source portion 140 is disposed in parallel to one side surface of the light guide plate 150, and the extrusion bar 170 may be disposed on the one side surface of the light guide plate 150 in the shape of a bar or a line.

The extrusion bar 170 may include a first area 171 arranged to contact a back surface portion 181 of the lower frame 180, and a second area 172 arranged to contact a side surface portion 182 of the lower frame 180. The second area 172 of the extrusion bar 170 may be coupled to the frame chassis 190, which will be described below.

The extrusion bar 170 may include a metal material having high rigidity and high heat dissipation characteristics. In one exemplary embodiment, for example, the extrusion bar 170 may include at least one selected from stainless steel, aluminum, an aluminum alloy, magnesium, a magnesium alloy, copper, a copper alloy, and an electrogalvanized steel sheet. The extrusion bar 170 may serve to dissipate a heat generated in the light source portion 140, the wavelength conversion portion (not illustrated), or the like to the outside.

The lower frame 180 may accommodate the intermediate frame 130, the light source portion 140, the light guide plate 150, the reflection sheet 160, the extrusion bar 170, or the like. The lower frame 180 may include the back surface portion 181, the side surface portion 182 bent and extending from the back surface portion 181, and a bent portion 183 bent and extending from the side surface portion 182. In an exemplary embodiment, as shown in FIG. 2, the bent portion 183 may be bent and extend only at the side surface portion 182 opposing the light source portion 140, for example.

The lower frame 180 may include a metal material having high rigidity and high heat dissipation characteristics. In one exemplary embodiment, for example, the lower frame 180 may include at least one selected from stainless steel, aluminum, an aluminum alloy, magnesium, a magnesium alloy, copper, a copper alloy, and an electrogalvanized steel sheet.

Figure 3:
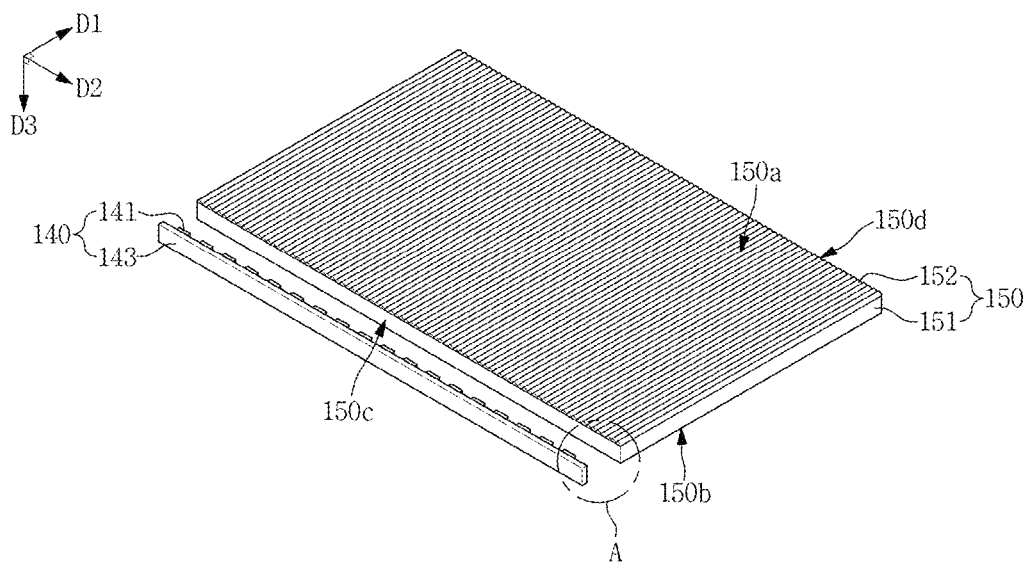
FIG. 3 is a perspective view illustrating a light guide plate and a light source portion according to an exemplary embodiment.
Figure 4:
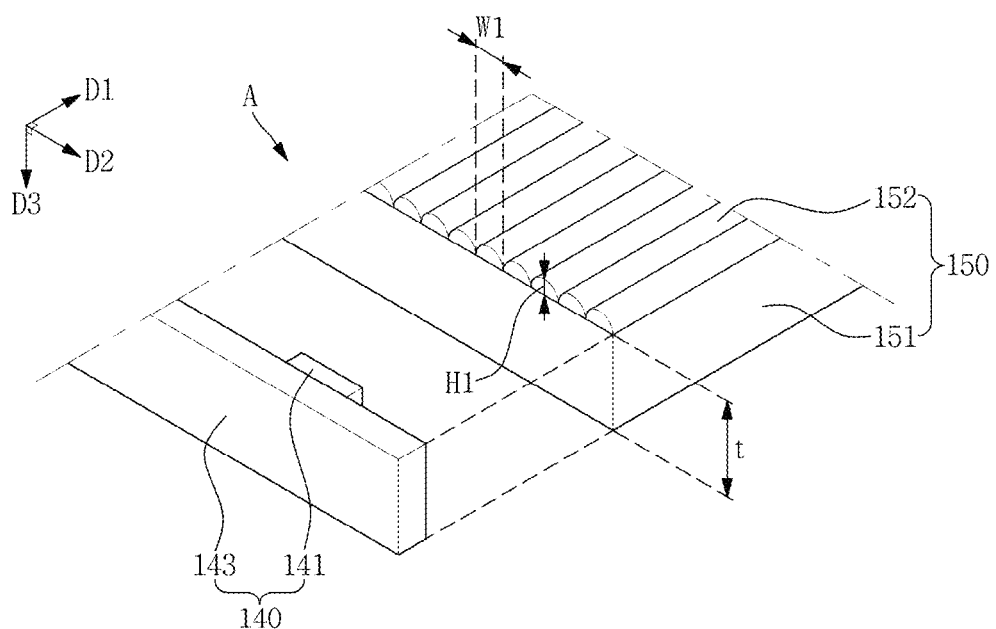
FIG. 4 is a partial enlarged view illustrating a portion A of FIG. 3.

FIG. 3 is a perspective view illustrating a light guide plate and a light source portion according to an exemplary embodiment, and FIG. 4 is a partial enlarged view illustrating a portion A of FIG. 3. More particularly, FIGS. 3 and 4 are perspective views illustrating the upper surface 150a and the light incidence surface 150c of the light guide plate 150 according to an exemplary embodiment.

Referring to FIGS. 3 and 4, in an exemplary embodiment, the light guide plate 150 may include the lens pattern 152 defined on the upper surface 150a. In an exemplary embodiment, as shown in FIG. 4, the lens pattern 152 may include a plurality of lenses extending in the first direction D1 and arranged along the second direction D2, but exemplary embodiments are not limited thereto. In an alternative exemplary embodiment, the lens pattern 152 may include a plurality of lenses extending in the second direction D2 and arranged along the first direction D1. In an exemplary embodiment, as shown in FIG. 4, each lens may have a semicircular or semi-elliptical cross-section. In an alternative exemplary embodiment, each lens may have a circular or triangular cross-section, and respective cross-sectional areas of the plurality of lenses may be different from each other.

In an exemplary embodiment, a thickness t of the body portion 151 may be in a range from about 0.5 millimeter (mm) to about 3.5 mm. In one exemplary embodiment, for example, where the body portion 151 includes PMMA or PC, the body portion 151 may have a thickness t in a range from about 2.0 mm to about 3.5 mm. In one alternative exemplary embodiment, for example, where the body portion 151 includes a tempered glass, the body portion 151 may have a thickness t in a range from about 0.5 mm to about 1.5 mm.

In an exemplary embodiment, the lens may have a width W1 in a range from about 3 micrometers (μm) to about 30 μm in the second direction D2 and a height H1 in a range from about 3 μm to about 15 μm. In an exemplary embodiment, as shown in FIGS. 3 and 4, the lenses adjacent to each other in the second direction D2 may be continuously formed, that is, he lenses adjacent to each other in the second direction D2 are in contact with each other with no interval therebetween, but exemplary embodiments are not limited thereto. In an alternative exemplary embodiment, the plurality of lenses may be disposed apart from each other at a predetermined interval in the second direction D2.

In such an embodiment, since the light guide plate 150 includes the lens pattern 152 on the upper surface 150a, the light guide plate 150 may collimate the light dissipated through the light guide plate 150 and the light guide plate 150 may be effectively prevented from being visible from the outside. Accordingly, a separate optical sheet may be omitted.

Figure 5:
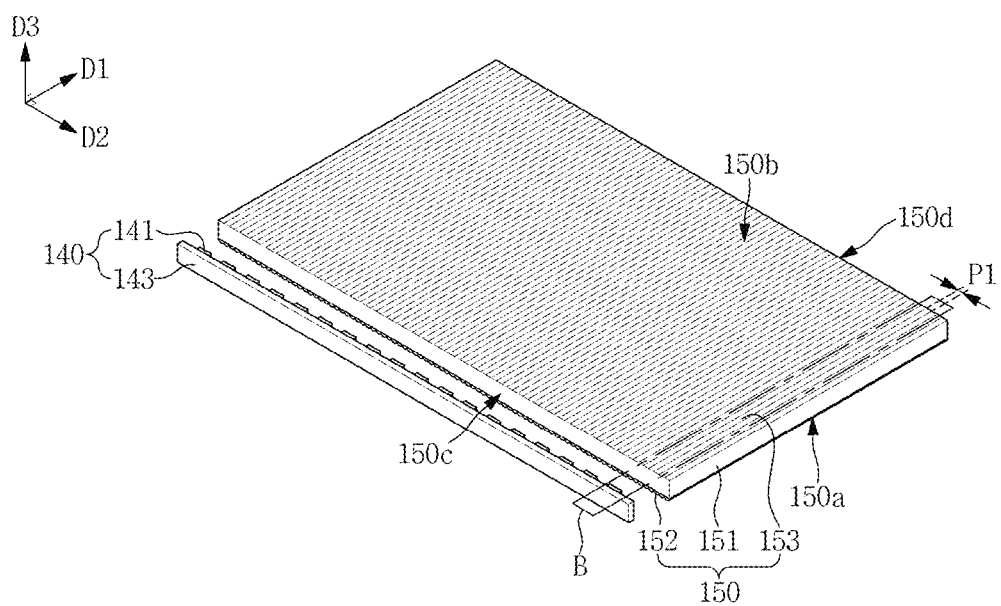
FIG. 5 is a perspective view illustrating a light guide plate and a light source portion according to an alternative exemplary embodiment.
Figure 6:
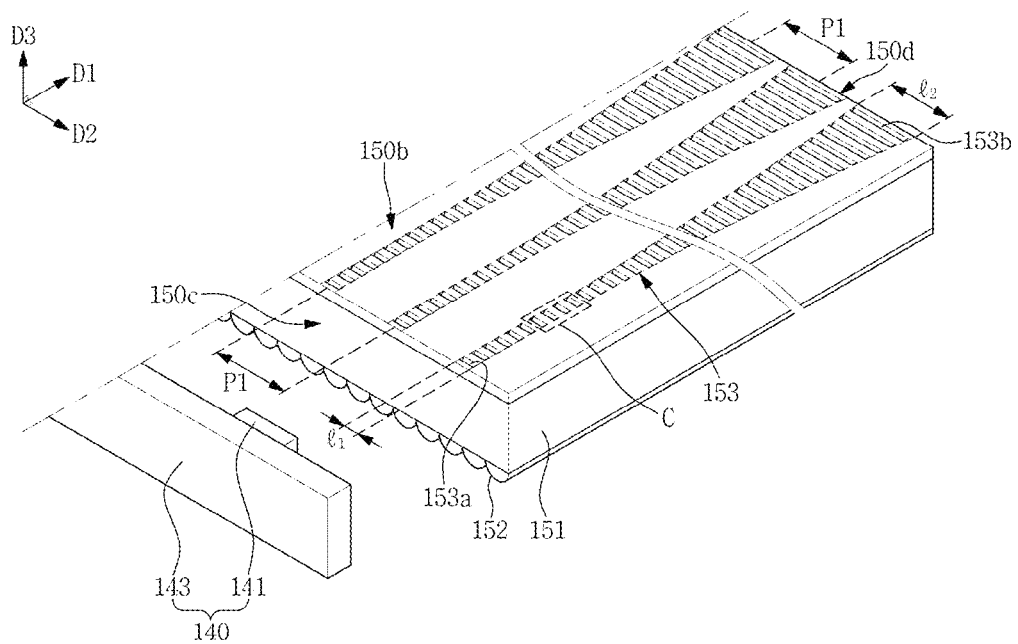
FIG. 6 is a partial enlarged view illustrating a portion B of FIG. 5.
Figure 7:
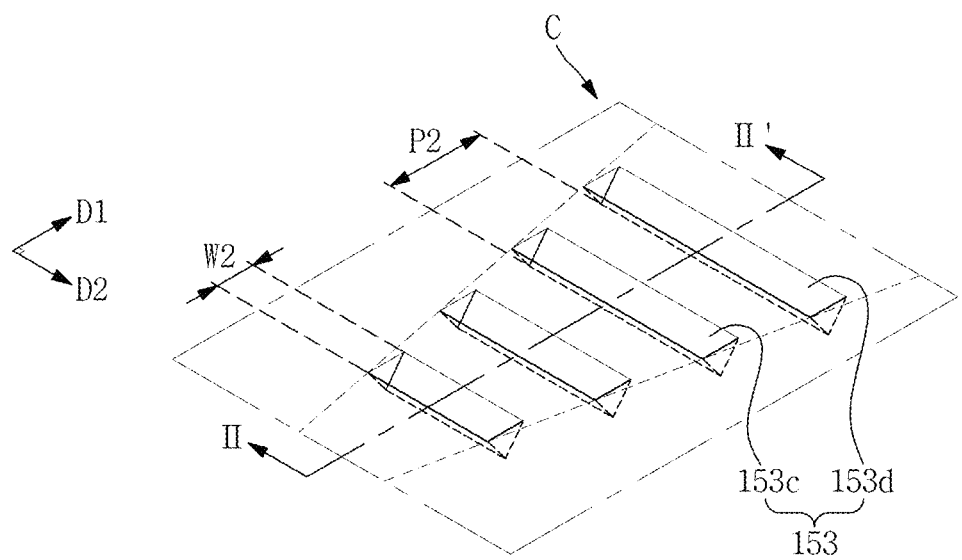
FIG. 7 is a partial enlarged view illustrating a portion C of FIG. 6.
Figure 8:
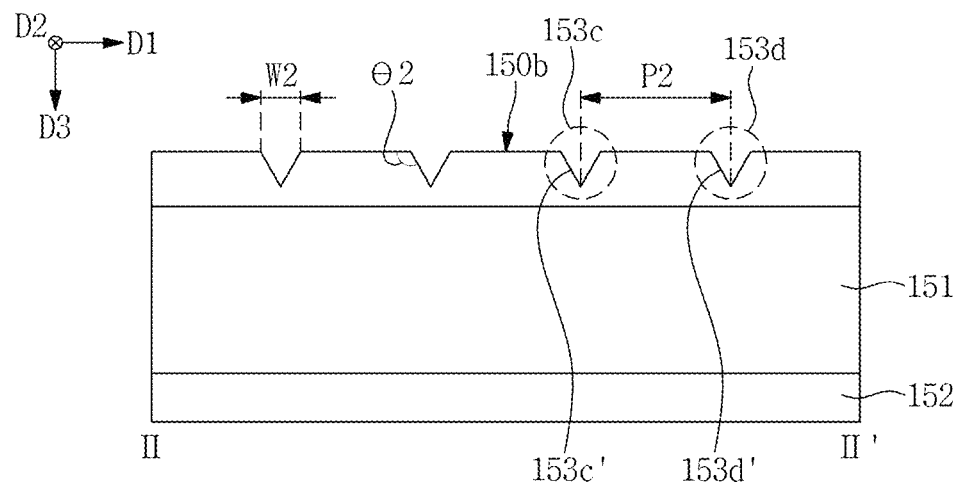
FIG. 8 is a cross-sectional view taken along line II-II' of FIG. 7.

FIG. 5 is a perspective view illustrating a light guide plate and a light source portion according to an alternative exemplary embodiment, FIG. 6 is a partial enlarged view illustrating a portion B of FIG. 5, FIG. 7 is a partial enlarged view illustrating a portion C of FIG. 6, and FIG. 8 is a cross-sectional view taken along line of FIG. 7. More particularly, FIGS. 5 and 6 are perspective views illustrating the lower surface 150b and the light incidence surface 150c of the light guide plate 150 according to an exemplary embodiment.

Referring to FIGS. 5 and 6, in an exemplary embodiment, the light guide plate 150 may include a prism pattern 153 defined on the lower surface 150b. The prism pattern 153 may include a plurality of prisms 153a and 153b arranged along the first direction D1 which is perpendicular to the light incidence surface 150c. Each of the prisms 153a and 153b may have a length extending in the second direction D2 which is parallel to the light incidence surface 150c.

In an exemplary embodiment, as shown in FIG. 6, the length of the plurality of prisms 153a and 153b arranged along the first direction D1 may gradually increase from the light incidence surface 150c toward the light opposing surface 150d. In such an embodiment, a length l1 of the prism 153a disposed adjacent to the light incidence surface 150c is the shortest, and a length l2 of the prism 153b disposed adjacent to the light opposing surface 150d is the longest.

Each of the prisms 153a and 153b may have a length in a range from about 3 μm to about 300 μm.

In an exemplary embodiment, the prisms 153a and 153b may have at least one of a recessed (e.g., a depressed or engraved) shape or a protruded (e.g., embossed) shape. In one exemplary embodiment, for example, the prisms 153a and 153b are recessed (e.g., depressed or engraved) patterns, as shown in FIG. 7.

The prism pattern 153 may include a plurality of prism patterns arranged along the second direction D2 which is parallel to the light incidence surface 150c, and a pitch P1 between two adjacent prisms disposed adjacent to each other in the second direction D2, among the prism patterns 153, may be in a range from about 50 μm to about 300 μm. Here, the pitch between two adjacent prisms may be defined by a distance between centers thereof.

Referring to FIGS. 7 and 8, in an exemplary embodiment, each of the prisms 153c and 153d may have a width W2 in a range from about 3 μm to about 30 μm. In such an embodiment, the prisms 153c and 153d may be spaced apart from each other at a predetermined pitch P2 in the first direction D1. In an exemplary embodiment, as shown in FIG. 7, the pitches P2 between adjacent ones of the prisms 153c and 153d adjacent to each other in the first direction D1 may be equal to each other, but exemplary embodiments are not limited thereto. In an alternative exemplary embodiment, the pitch P2 between adjacent ones of the prisms 153c and 153d adjacent to each other in the first direction D1 may decrease from the light incidence surface 150c toward the light opposing surface 150d.

In an exemplary embodiment, as shown in FIG. 8, an angle θ2 between oblique surfaces 153c' and 153d' of the prisms 153c and 153d and the lower surface 150b of the light guide plate 150 may be in a range from about 127 degrees to about 134 degrees.

Referring back to FIGS. 5 and 6, in an exemplary embodiment, since the plurality of prisms 153a and 153b having a length gradually increasing from the light incidence surface 150c toward the light opposing surface 150d are defined on the lower surface 150b of the light guide plate, the light emitted through the light guide plate 150 may be uniformly provided to the display panel. In an exemplary embodiment, the light provided from the light source portion 140 may become weaker from the light incidence surface 150c toward the light opposing surface 150d.

Accordingly, in an exemplary embodiment, an amount of light reflected through the prisms 153a disposed adjacent to the light incidence surface 150c is desired to be reduced, and an amount of light reflected through the prisms 153a adjacent to the light opposing surface 150d is desired to be increased, to supply uniform light to the display panel.

According to an exemplary embodiment, uniform light may be supplied to the display panel by substantially minimizing the length of the prisms 153a disposed adjacent to the light incidence surface 150c and gradually increasing the lengths of the prisms.

Figure 9:
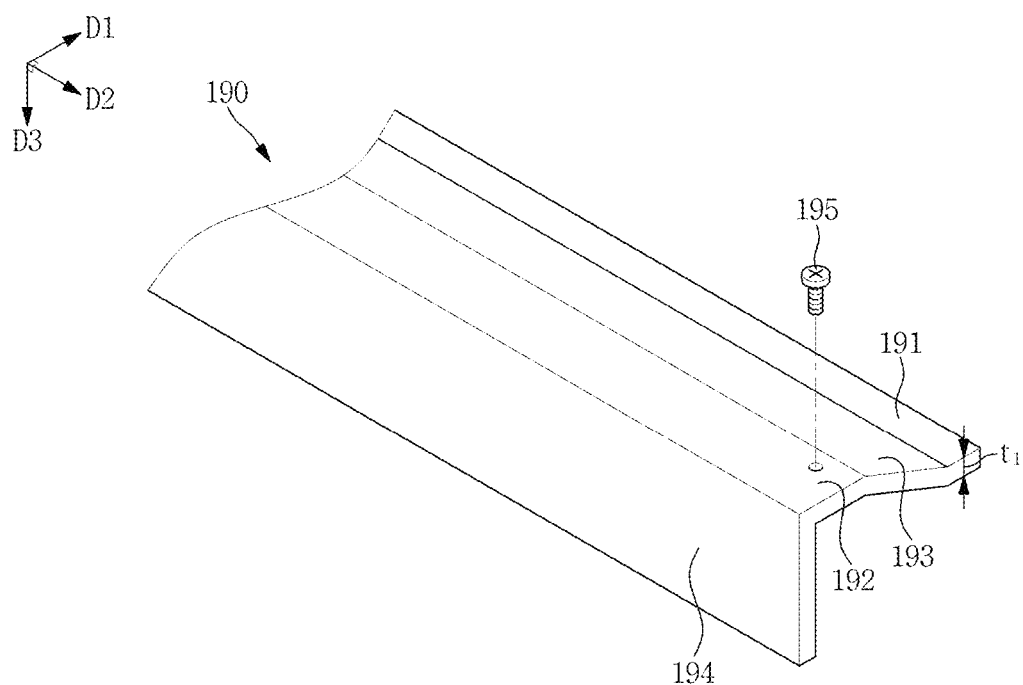
FIG. 9 is a perspective view illustrating a frame chassis according to an exemplary embodiment.

FIG. 9 is a perspective view illustrating a frame chassis according to an exemplary embodiment. In an exemplary embodiment, the frame chassis may have a thin metal chassis structure such as the upper frame or the lower frame.

Referring to FIGS. 1, 2 and 9, an exemplary embodiment of the frame chassis 190 may include a fastening portion 191 that fastens a portion of the upper surface 150a of the light guide plate 150 and be inserted to a space between the display panel 120 and the light guide plate 150, a coupling portion 192 coupled to at least one of the extrusion bar 170 and the lower frame 180, a connection portion 193 connecting the fastening portion 191 and the coupling portion 192, a side wall portion 194 bent from the coupling portion 192 to extend therefrom, or the like.

The fastening portion 191 may fasten a portion of the upper surface 150a of the light guide plate 150 adjacent to the light source portion 140. The fastening portion 191, along with the bent portion 183 of the lower frame 180, may fasten the light guide plate 150 to effectively prevent the light guide plate 150 from being dislocated in a thickness direction (e.g., the third direction D3).

In an exemplary embodiment, since the bent portion 183 of the lower frame 180 and the fastening portions 191 of the frame chassis 190 fasten opposite end portions of the upper surface 150a of the light guide plate 150, the light guide plate 150 may be effectively prevented from being dislocated in the third direction in an assembly process.

In an exemplary embodiment, the fastening portion 191 may have a thickness substantially equal to a thickness of the lower polarization plate 121a. In such an embodiment, a thickness t1 of the fastening portion 191 may be substantially equal to a thickness t2 of the lower polarization plate 121a. In one exemplary embodiment, for example, the thickness t1 of the fastening portion 191 may be in a range from about 0.3 mm to about 1.0 mm.

In an exemplary embodiment, the bent portion 183 of the lower frame 180 may have a thickness substantially equal to a thickness of the lower polarization plate 121a. In such an embodiment, a thickness t3 of the bent portion 183 may be substantially equal to the thickness t2 of the lower polarization plate 121a. In one exemplary embodiment, for example, the thickness t3 of the bent portion 183 may be in a range from about 0.3 mm to about 1.0 mm.

In an exemplary embodiment, as described above, since the fastening portion 191 of the frame chassis 190 and the bent portion 183 of the lower frame 180 have thicknesses substantially equal to the thickness of the lower polarization plate 121a, the light guide plate 150 and the display panel 120 may be disposed adjacent to each other.

In an exemplary embodiment, as shown in FIG. 2, the coupling portion 192 may be coupled to the extrusion bar 170, but exemplary embodiments are not limited thereto. In an alternative exemplary embodiment, the coupling portion 192 may be coupled to the lower frame 180.

The coupling portion 192 may be coupled to the second area 172 of the extrusion bar 170. In one exemplary embodiment, for example, the coupling portion 192 may be engaged with the extrusion bar 170 by a screw 195. However, exemplary embodiments are not limited thereto, and alternatively hooking, screwing, or the like may be used to engage the coupling portion 192 with the extrusion bar 170.

In an exemplary embodiment, the screw 195 couples the coupling portion 192 with the extrusion bar 170 in the third direction D3.

In an exemplary embodiment, a length in the first direction D1 of the connection portion 193, which connects the fastening portion 191 with the coupling portion 192, may have a value determined based on a distance between the light source portion 140 and the light guide plate 150. In such an embodiment, a reflection member 196 may be further disposed on a back surface of the connection portion 193 facing the light source portion 140.

The reflection member 196 reflects the light emitted from the light source 141 to be incident to the light incidence surface 150c of the light guide plate 150. The reflection member 196 may include a reflective material such as polyethylene terephthalate ("PET"), titanium dioxide, and silver (Ag).

The side wall portion 194 of the frame chassis 190 may be coupled to the side surface portion 182 of the lower frame 180 or may be omitted.

The frame chassis 190 may include a metal material having high rigidity and high heat dissipation characteristics. In one exemplary embodiment, for example, the frame chassis 190 may include at least one selected from stainless steel, aluminum, an aluminum alloy, magnesium, a magnesium alloy, copper, a copper alloy, and an electrogalvanized steel sheet.

Figure 10:
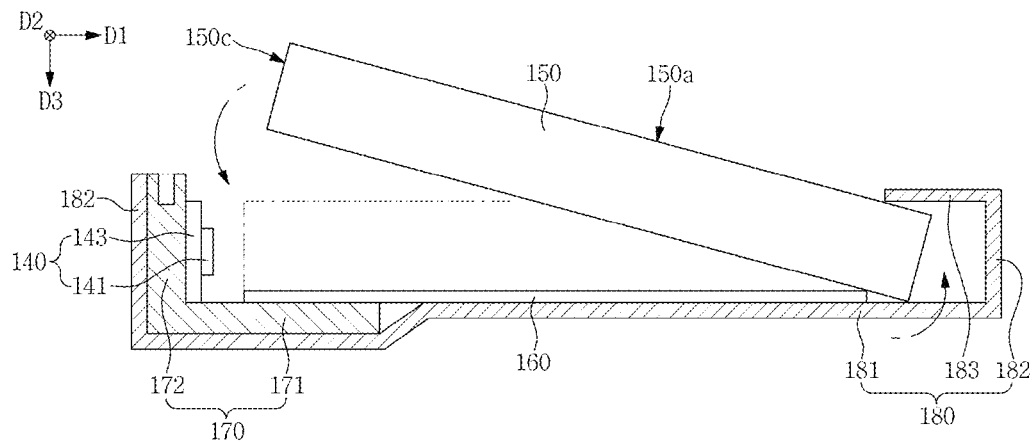
FIGS. 10 and 11 are views illustrating a process of assembling a light guide plate according to an exemplary embodiment.
Figure 11:
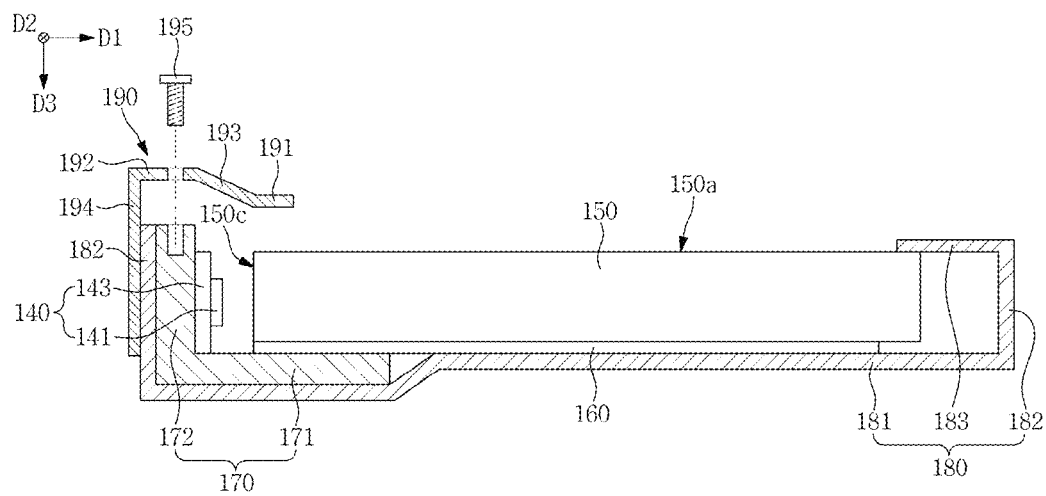

FIGS. 10 and 11 are views illustrating a process of assembling a light guide plate according to an exemplary embodiment.

Referring to FIG. 10, an exemplary embodiment of an assembly process of the light guide plate includes disposing the extrusion bar 170 and the reflection sheet 160 on the back surface portion 181 of the lower frame 180, and disposing the light source portion 140 on the extrusion bar 170 sequentially.

Subsequently, an end portion of the light guide plate 150 is inserted into the lower frame 180 in a sliding manner to be fastened by the bent portion 183 of the lower frame 180, and another end portion of the light guide plate 150 is disposed adjacent to the light source portion 140.

Referring to FIG. 11, the upper surface 150a of the light guide plate 150 adjacent to the light source portion 140 may be fastened, using the frame chassis 190. The frame chassis 190 may include the fastening portion 191 for fastening the upper surface 150a of the light guide plate 150 and the coupling portion 192 to be coupled with the extrusion bar 170.

The fastening portion 191 may fasten the light guide plate 150 so that the light guide plate 150 may not be dislocated in the third direction D3, and the screw 195 for coupling the extrusion bar 170 and the coupling portion 192 may be coupled thereto in the third direction D3.

In such an embodiment, since the bent portion 183 of the lower frame 180 and the fastening portion 191 of the frame chassis 190 fasten opposite end portions of the upper surface 150a of the light guide plate 150, the light guide plate 150 may be effectively prevented from being dislocated in the third direction D3 in the assembly process.

Figure 12:
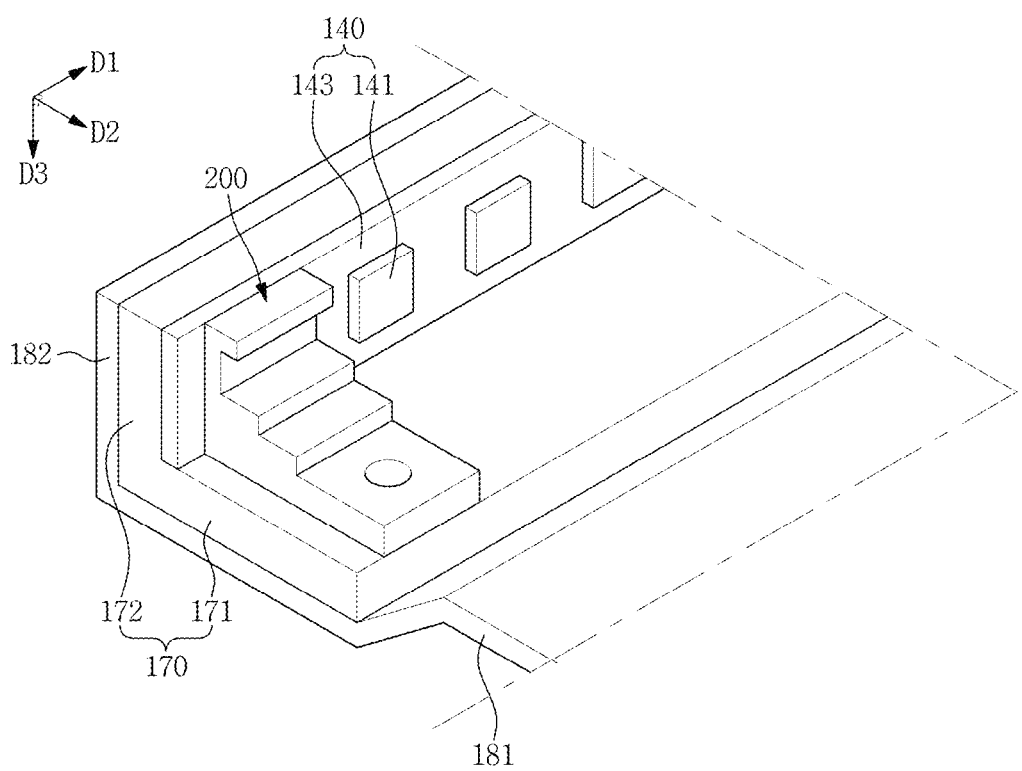
FIG. 12 is a partial perspective view illustrating a light source, a frame chassis, or the like according to an exemplary embodiment.
Figure 13:
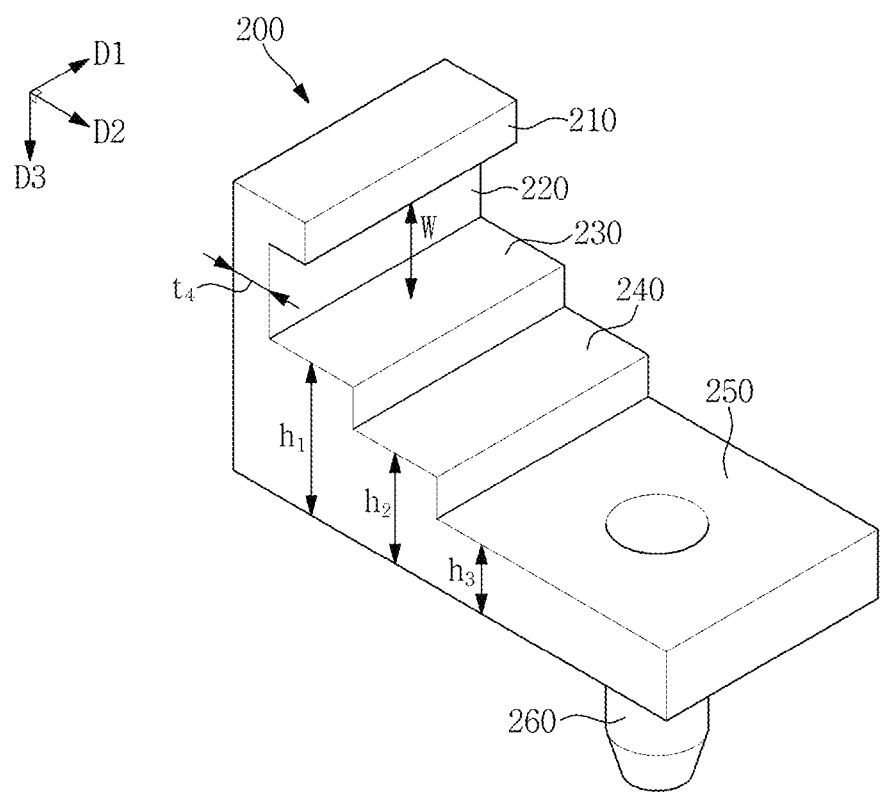
FIG. 13 is a perspective view illustrating a frame chassis of FIG. 12.
Figure 14:
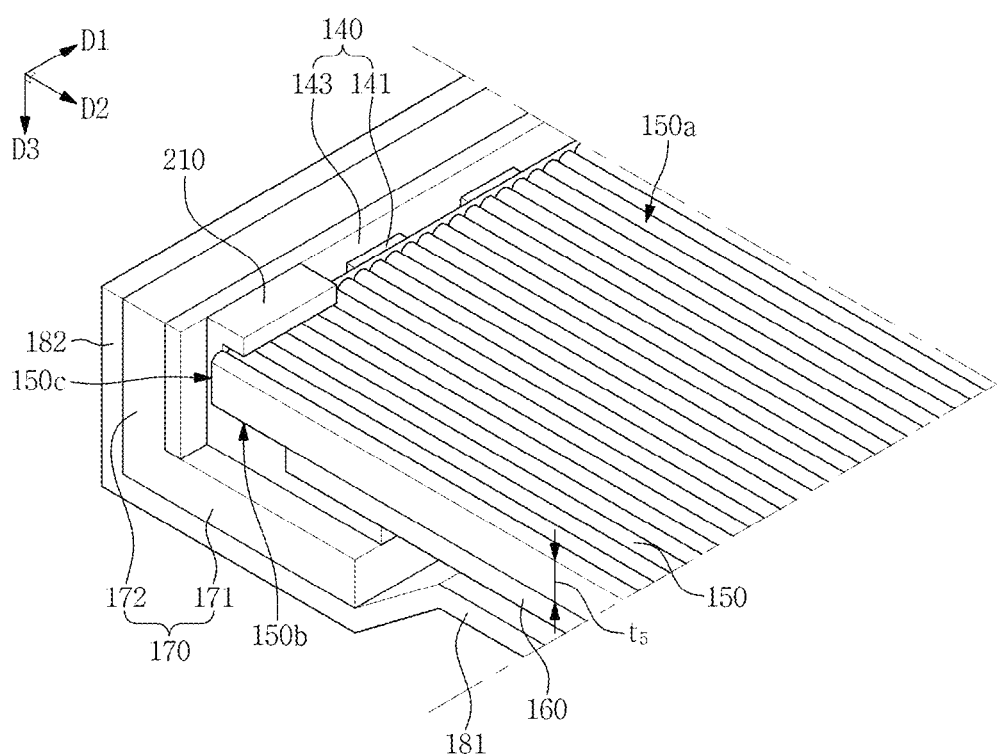
FIG. 14 is a partial perspective view illustrating a frame chassis, a reflection sheet, a light guide plate, or the like according to an exemplary embodiment.

FIG. 12 is a partial perspective view illustrating a light source, a frame chassis, or the like according to an exemplary embodiment, FIG. 13 is a perspective view illustrating a frame chassis shown in FIG. 12, and FIG. 14 is a partial perspective view illustrating a frame chassis, a reflection sheet, a light guide plate, or the like according to an exemplary embodiment.

Referring to FIGS. 1, 12, 13, and 14, an exemplary embodiment of the LCD device may include the light guide plate holder 200 at an edge portion of the lower frame 180. In particular, the light guide plate holder 200 may be disposed adjacent to the light source portion 140.

The light guide plate holder 200 may include a support portion 210, a side wall portion 220 and a light guide plate seating portion 230 for fastening the upper surface 150a, the light incidence surface 150c and the lower surface 150b of the light guide plate 150.

In an exemplary embodiment, a distance between the light source 141 and the light guide plate 150 may be determined based on a thickness t4 of the side wall portion 220 of the light guide plate holder 200. In such an embodiment, a distance W between the support portion 210 and the light guide plate seating portion 230 may be substantially equal to a thickness t5 of the light guide plate 150.

The light guide plate holder 200 may further include a reflection sheet seating portion 240 which extends with a height h2 that is less than a height h1 of the light guide plate seating portion 230, a light guide plate holder fastening portion 250 which extends with a height h3 that is less than the height h2 of the reflection sheet seating portion 240, a protrusion portion 260 which extends in the third direction D3 from the light guide plate holder fastening portion 250, or the like.

The reflection sheet 160 may be disposed on the reflection sheet seating portion 240 and the light guide plate holder fastening portion 250 may be fastened to the extrusion bar 170 or the lower frame 180. The protrusion portion 260 may function as a guide for fastening the light guide plate holder 200 to the extrusion bar 170 or the lower frame 180.

The light guide plate holder 200 may be coupled to the extrusion bar 170 or the lower frame 180 by a hook, a screw, a double-sided adhesive tape, or the like.

The light guide plate holder 200 may include a flexible material such as plastic or may be integrally formed as a single unitary and indivisible unit through an injection molding process or the like.

The light guide plate holder 200 may be fastened to the extrusion bar 170 or the lower frame 180 to fasten the reflection sheet 160 and the light guide plate 150.

In one or more exemplary embodiments, as set forth hereinabove, a slimmer LCD device may be realized and manufacturing costs may be reduced by omitting the optical sheet.

In such embodiments, the LCD device may have a new frame structure for accommodating and fastening the light source, the light guide plate, or the like.

While the invention has been illustrated and described with reference to the exemplary embodiments thereof, it will be apparent to those of ordinary skill in the art that various changes in form and detail may be formed thereto without departing from the spirit and scope of the invention.

What is claimed is:

1. A liquid crystal display device comprising:
   a display panel;
   a light source which provides a light to the display panel;
   a light guide plate which receives the light from the light source on a surface thereof and guides the light to another surface thereof;
   a lower frame which accommodates the light source and the light guide plate;
   a polarization member on a surface of the display panel facing the light guide plate;
   a frame chassis comprising a fastening portion inserted in a space between the display panel and the light guide plate and a coupling portion extending from the fastening portion; and
   an extrusion bar comprising a first portion between the light source and the lower frame in a first direction parallel to major surface planes defining the light guide plate, and a second portion extending from the first portion and disposed between the light guide plate and the lower frame in a second direction normal to the major surface planes,
      wherein the fastening portion has a thickness substantially equal to a thickness of the polarization member, and
   an upper portion of the first portion of the extrusion bar is coupled to the coupling portion of the frame chassis.

2. The liquid crystal display device of claim 1, wherein the light guide plate comprises;
   a light incidence surface facing the light source;
   a light opposing surface opposing the light incidence surface;
   an upper surface facing the display panel; and
   a lower surface opposing the upper surface.

3. The liquid crystal display device of claim 2, wherein the fastening portion fastens a portion of the upper surface adjacent to the light incidence surface.

4. The liquid crystal display device of claim 1, wherein the frame chassis is coupled to the extrusion bar in a screw coupling manner.

5. The liquid crystal display device of claim 1, wherein the fastening portion has a thickness in a range from about 0.3 millimeter to about 1.0 millimeter.

6. The liquid crystal display device of claim 1, wherein the frame chassis comprises at least one of stainless steel, aluminum, an aluminum alloy, magnesium, a magnesium alloy, copper, a copper alloy, and an electrogalvanized steel sheet.

7. The liquid crystal display device of claim 1, wherein the frame chassis further comprises a reflection member disposed on a surface of the frame chassis facing the light source.

8. The liquid crystal display device of claim 1, wherein the lower frame comprises:
   a back surface portion;
   a side surface portion bent and extending from the back surface portion; and
   a bent portion bent and extending from the side surface portion.

9. The liquid crystal display device of claim 8, wherein the bent portion has a thickness substantially equal to a thickness of the polarization member.

10. The liquid crystal display device of claim 1, further comprising:
    a reflection sheet between the light guide plate and the lower frame.

11. The liquid crystal display device of claim 1, wherein the light guide plate comprises at least one of polymethylmethacrylate, an acrylic resin, polycarbonate, and a tempered glass.

12. A liquid crystal display device comprising:
    a display panel;
    a light source which provides a light to the display panel;
    a light guide plate which receives the light from the light source on a surface thereof and guides the light to another surface thereof;
    a polarization member on a surface of the display panel facing the light guide plate;
    a lower frame which accommodates the light source and the light guide plate; and
    a light guide plate holder disposed at an edge portion defining the lower frame, and disposed adjacent to and separate from the light source on a same surface plane upon which the light source is disposed,
       wherein the light guide plate holder and the light source do not overlap any same portion defining the lower frame, and
       wherein an entirety of both the light source and the light guide plate holder extend form only one side of and directly from the same surface plane upon which the light source is disposed.

13. The liquid crystal display device of claim 12, wherein the light guide plate holder further comprises a support portion, a side wall portion, and a light guide plate seating portion, which collectively fasten an upper surface, a light incidence surface, a lower surface of the light guide plate, and a reflection sheet seating portion extending from the light guide plate seating portion with a height less than a height of the light guide plate seating portion.

14. A liquid crystal display device comprising:
a display panel;
a light source which provides a light to the display panel;
a light guide plate which receives the light from the light source on a surface thereof and guides the light to another surface thereof;
a polarization member on a surface of the display panel facing the light guide plate;
a lower frame which accommodates the light source and the light guide plate; and
a light guide plate holder disposed at an edge portion defining the lower frame, and disposed adjacent to and separate from the light source on a same surface plane defining the lower frame,
the light guide plate holder comprises a support portion, a side wall portion, and a light guide plate seating portion, which collectively fasten an upper surface, a light incidence surface and a lower surface of the light guide plate,
wherein the light guide plate holder further comprises a reflection sheet seating portion extending from the light guide plate seating portion with a height less than a height of the light guide plate seating portion, and
wherein the light guide plate holder further comprises a light guide plate holder fastening portion extending from the reflection sheet seating portion with a height less than a height of the reflection sheet seating portion.

15. The liquid crystal display device of claim 14, wherein the light guide plate holder further comprises a protrusion portion protruding from the light guide plate holder fastening portion.

16. A liquid crystal display device comprising:
a display panel;
a light source which provides a light to the display panel;
a light guide plate which receives the light from the light source on a surface thereof and guides the light to another surface thereof;
a polarization member on a surface of the display panel facing the light guide plate;
a lower frame which accommodates the light source and the light guide plate;
a frame chassis comprising a fastening portion, a coupling portion extending from the fastening portion and a sidewall portion extending from the fastening portion, the fastening portion inserted in a space between the display panel and the light guide plate, and the sidewall portion faces a light incidence surface of the light guide plate facing the light source with the light source therebetween; and
an extrusion bar comprising a first portion between the light source and the lower frame in a first direction parallel to major surface planes defining the light guide plate, and a second portion extending from the first portion and disposed between the light guide plate and the lower frame in a second direction normal to the major surface planes,
wherein the light guide plate comprises:
the light incidence surface facing the light source;
a light opposing surface opposing the light incidence surface;
an upper surface facing the display panel; and
a lower surface opposing the upper surface, and
the light guide plate further comprises a lens pattern defined on the upper surface, and
an upper portion of the first portion of the extrusion bar is coupled to the coupling portion of the frame chassis.

17. The liquid crystal display device of claim 16, wherein the lens pattern comprises a plurality of lenses, which extends in the first direction and arranged along a third direction which crosses the first direction.

18. The liquid crystal display device of claim 17, wherein the lens has a semicircular or semi-elliptical cross-section.

19. The liquid crystal display device of claim 17, wherein the light guide plate comprises a prism pattern defined on the lower surface.

20. The liquid crystal display device of claim 19, wherein the prism pattern comprises a plurality of prisms arranged along a direction perpendicular to the light incidence surface.

21. The liquid crystal display device of claim 20, wherein
the prisms have a length extending in a direction parallel to the light incidence surface, and
the length of the prisms gradually increases from the light incidence surface toward the light opposing surface.

22. The liquid crystal display device of claim 20, wherein the prisms have at least one of a recessed shape or a protruded shape.

23. A liquid crystal display device comprising:
a display panel;
a light source which provides a light to the display panel;
a light guide plate which receives the light from the light source on a surface thereof and guides the light to another surface thereof;
a polarization member on a surface of the display panel facing the light guide plate;
a lower frame which accommodates the light source and the light guide plate; and
a light guide plate holder disposed at an edge portion defining the lower frame, and disposed adjacent to and separate from the light source on a same surface plane upon which the light source is disposed,
wherein the light guide plate holder and the light source do not overlap any same portion defining the lower frame,
the light guide plate holder comprises a support portion, a side wall portion, and a light guide plate seating portion, which collectively fasten an upper surface, a light incidence surface and a lower surface of the light guide plate, and
the side wall portion has a thickness substantially equal to a distance between the same surface plane and the light guide plate.

* * * * *